(12) United States Patent
Tung

(10) Patent No.: US 10,068,969 B2
(45) Date of Patent: Sep. 4, 2018

(54) NANOWIRE TRANSISTOR AND METHOD FOR FABRICATING THE SAME

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/146,898

(22) Filed: May 5, 2016

(65) Prior Publication Data

US 2017/0288018 A1   Oct. 5, 2017

(30) Foreign Application Priority Data

Apr. 1, 2016   (TW) .............................. 105110463 A

(51) Int. Cl.
| | |
|---|---|
| H01L 29/06 | (2006.01) |
| H01L 29/16 | (2006.01) |
| H01L 29/49 | (2006.01) |
| H01L 23/535 | (2006.01) |
| H01L 29/786 | (2006.01) |
| H01L 29/66 | (2006.01) |
| H01L 21/306 | (2006.01) |

(52) U.S. Cl.
CPC .... *H01L 29/0673* (2013.01); *H01L 21/30604* (2013.01); *H01L 23/535* (2013.01); *H01L 29/16* (2013.01); *H01L 29/4975* (2013.01); *H01L 29/66553* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,173,993 B2 | 5/2012 | Bangsaruntip et al. | |
| 9,059,200 B1 | 6/2015 | Chu et al. | |
| 9,064,944 B2 | 6/2015 | Kim et al. | |
| 9,147,594 B2 | 9/2015 | Lee et al. | |
| 2013/0207079 A1* | 8/2013 | Sleight | H01L 29/775 257/24 |
| 2014/0197370 A1* | 7/2014 | Leobandung | H01L 29/66439 257/9 |
| 2014/0264280 A1* | 9/2014 | Kim | H01L 29/785 257/29 |
| 2015/0035071 A1* | 2/2015 | Ching | H01L 27/092 257/369 |
| 2015/0214318 A1 | 7/2015 | Ching et al. | |
| 2015/0270134 A1 | 9/2015 | Xu et al. | |
| 2015/0270398 A1 | 9/2015 | Jacob et al. | |

(Continued)

*Primary Examiner* — Daniel Whalen
(74) *Attorney, Agent, or Firm* — Winston Hsu

(57) ABSTRACT

A method for fabricating a nanowire transistor is disclosed. First, a substrate is provided, and a stack structure is formed on the substrate, in which the stack structure includes a first semiconductor layer and a second semiconductor layer and the first semiconductor layer and the second semiconductor layer are made of different material. Next, a hard mask is formed on the stack structure and a first spacer adjacent to the hard mask, part of the stack structure is removed; a second spacer is formed adjacent to the first spacer and the stack structure; and a source/drain structure is formed adjacent to two sides of the second spacer.

6 Claims, 7 Drawing Sheets

(56) References Cited

U.S. PATENT DOCUMENTS

| | | |
|---|---|---|
| 2015/0303197 A1* | 10/2015 | Ching ............... H01L 29/66439 257/9 |
| 2015/0333162 A1* | 11/2015 | Bouche ............. H01L 21/76897 257/24 |
| 2015/0333167 A1* | 11/2015 | Leobandung ....... H01L 29/0673 257/347 |
| 2015/0340490 A1 | 11/2015 | An et al. |
| 2015/0372104 A1 | 12/2015 | Liu et al. |
| 2015/0372115 A1 | 12/2015 | Koh et al. |
| 2016/0005824 A1 | 1/2016 | Lin et al. |
| 2016/0020305 A1 | 1/2016 | Obradovic et al. |

* cited by examiner

NANOWIRE TRANSISTOR AND METHOD FOR FABRICATING THE SAME

BACKGROUND OF THE INVENTION

1. Field of the Invention

The invention relates to a method for fabricating nanowire transistor, and more particularly to a method of forming two spacers between gate structure and source/drain structure of a nanowire transistor.

2. Description of the Prior Art

In the past four decades, semiconductor industries keep downscaling the size of MOSFETs in order to achieve the goals of high operation speed and high device density. However, the reduction of device size won't last forever. When transistor shrink into or below 30 nm regime, leakage current due to severe short channel effects and thin gate dielectric causes the increase of off-state power consumption, and consequently causes functionality failure. One-dimensional devices based on nanowires or nanotubes are considered the immediate successors to replace the traditional silicon technology with relatively low technological risk. Nanowire transistor, which has higher carrier mobility and can be further enhanced by quantum confinement effect, is one of the most promising devices. In addition, the control of gate to channel can also be improved by using high-k dielectric layers.

SUMMARY OF THE INVENTION

According to a preferred embodiment of the present invention, a method for fabricating a nanowire transistor is disclosed. First, a substrate is provided, and a stack structure is formed on the substrate, in which the stack structure includes a first semiconductor layer and a second semiconductor layer and the first semiconductor layer and the second semiconductor layer are made of different material. Next, a hard mask is formed on the stack structure and a first spacer adjacent to the hard mask, part of the stack structure is removed; a second spacer is formed adjacent to the first spacer and the stack structure; and a source/drain structure is formed adjacent to two sides of the second spacer.

According to another aspect of the present invention, a nanowire transistor is disclosed. The nanowire transistor includes: a substrate; a nanowire channel layer on the substrate; a gate structure on and around the nanowire channel layer; a first spacer on the sidewalls of the gate structure; a second spacer on the sidewalls of the first spacer and the nanowire channel layer; and a source/drain structure adjacent to two sides of the second spacer.

According to another aspect of the present invention, a nanowire transistor is disclosed. The nanowire transistor includes: a substrate; a nanowire channel layer on the substrate; a gate structure on the nanowire channel layer; a source/drain structure adjacent to two sides of the gate structure, wherein the source/drain structure comprises metal; and a spacer between the nanowire channel layer and the source/drain structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
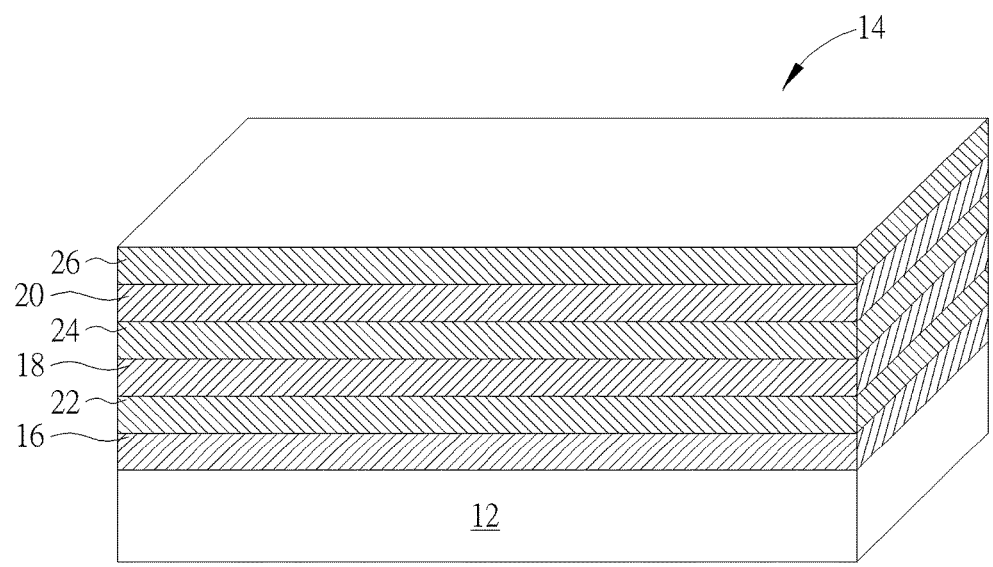
FIGS. 1-10 illustrate a method for fabricating a nanowire transistor according to a preferred embodiment of the present invention.

Referring to FIGS. 1-10, FIGS. 1-10 illustrate a method for fabricating a nanowire transistor according to a preferred embodiment of the present invention. As shown in FIG. 1, a substrate 12, such as a silicon substrate is provided, and a stack structure 14 is formed on the substrate 12. In this embodiment, the stack structure 14 is preferably composed of a plurality of first semiconductor layers 16, 18, 20 and second semiconductor layers 22, 24, 26 stacked interchangeably or one over another. Preferably, the first semiconductor layers 16, 18, 20 and second semiconductor layers 22, 24, 26 are composed of different material or different lattice constant, in which the first semiconductor layers 16, 18, 20 and second semiconductor layers 22, 24, 26 could all be selected from the group consisting of silicon, germanium, doped silicon, doped germanium, and silicon germanium. It should be noted that even though three layers of first semiconductor layers 16, 18, 20 and three layers of second semiconductor layers 22, 24, 26 are disclosed in this embodiment, the quantity of the first semiconductor layers 16, 18, 20 and second semiconductor layers 22, 24, 26 are not limited to the ones disclosed in this embodiment, but could all be adjusted according to the demand of the product.

Figure 2:
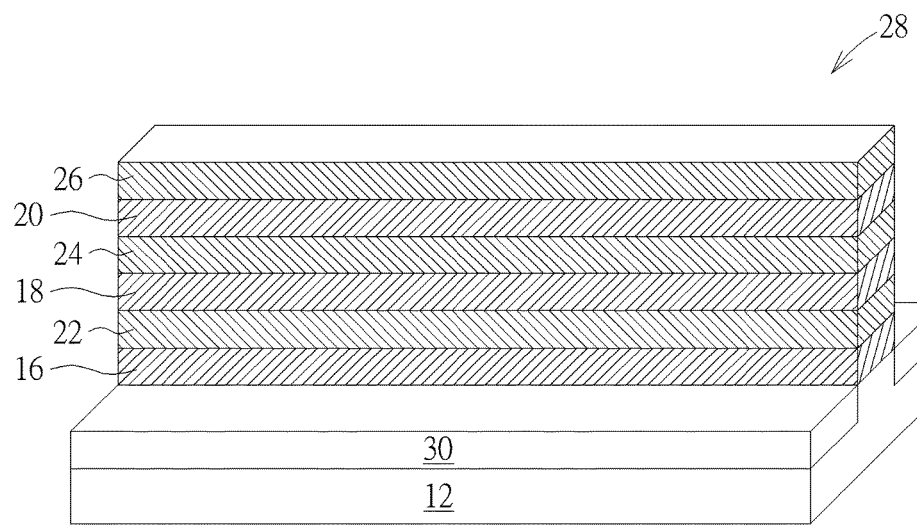

Next, as shown in FIG. 2, a photo-etching process is conducted by using a patterned resist (not shown) as mask to remove part of the stack structure 14 and part of the substrate 12 to form a recess 28 on the substrate 12. A dielectric layer 30 is then formed in the recess 28 to electrically isolate the patterned stack structure 14, in which a top surface of the dielectric layer 30 is preferably even with the bottom surface of the first semiconductor layer 16 on the lowest level. In this embodiment, the dielectric layer 30 is composed of silicon oxide, but not limited thereto.

Figure 3:
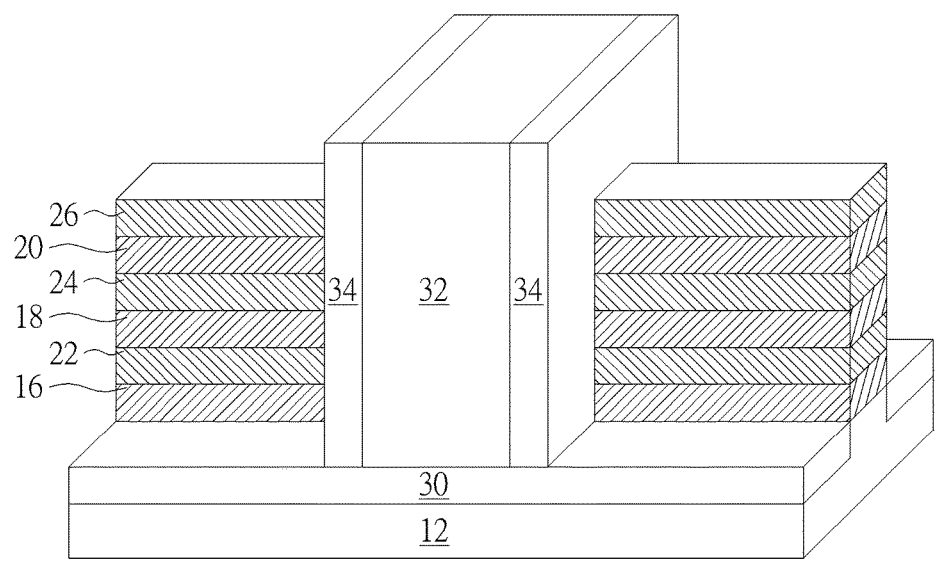

Next, as shown in FIG. 3, a hard mask 32 or sacrificial gate structure is formed across the stack structure 14, and a spacer 34 is formed on the sidewalls of the hard mask 32. In this embodiment, the hard mask 32 is composed of polysilicon, and the spacer 34 is selected from the group consisting of $SiO_2$, SiN, SiON, and SiCN, but not limited thereto. It should be noted that even though the spacer 34 in this embodiment is a single layered spacer, it would also be desirable to form a composite spacer according to the demand of the product. For instance, the spacer 34 could also be made of one or more spacers, in which the composite spacers could be made of same or different material. According to an embodiment of the present invention, a composite spacer could include a dual-layer spacer composed of both $SiO_2$ and SiN, or a triple-layer spacer composed of oxide-nitride-oxide, which are all within the scope of the present invention.

Figure 4:
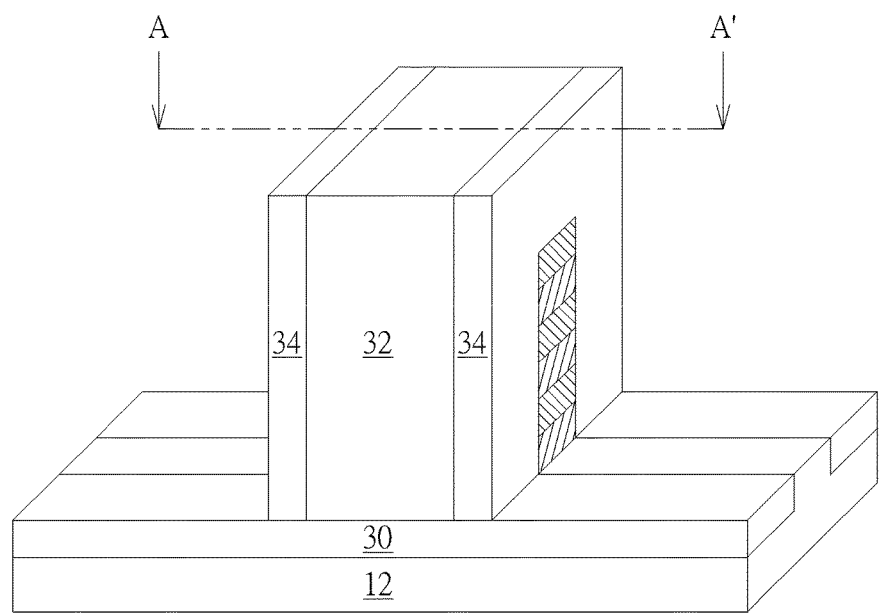
Figure 5:
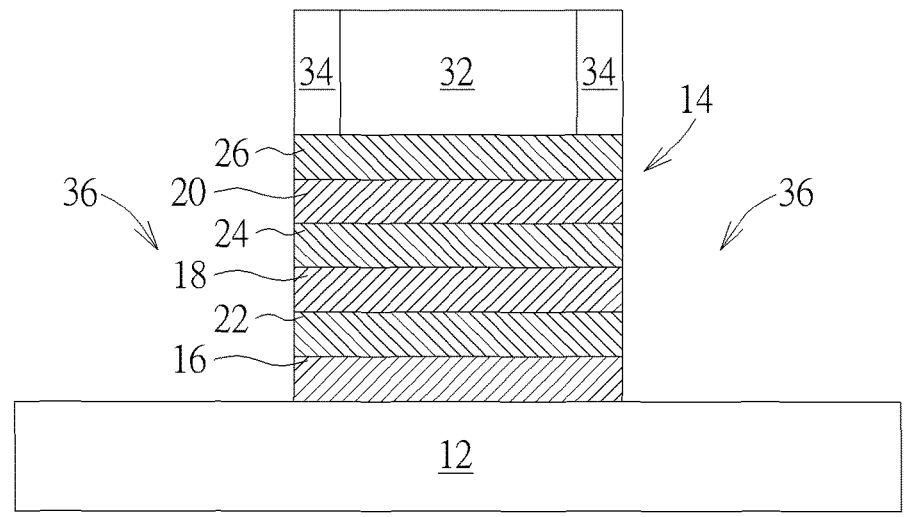

Next, referring to FIGS. 4-5, in which FIG. 5 illustrates a cross-sectional view of FIG. 4 along the sectional line AA'. As shown in FIGS. 4-5, a photo-etching process is then conducted or using the hard mask 32 directly as mask to remove part of the stack structure 14 adjacent to two sides of the spacer 34 for forming a recess 36.

Figure 6:
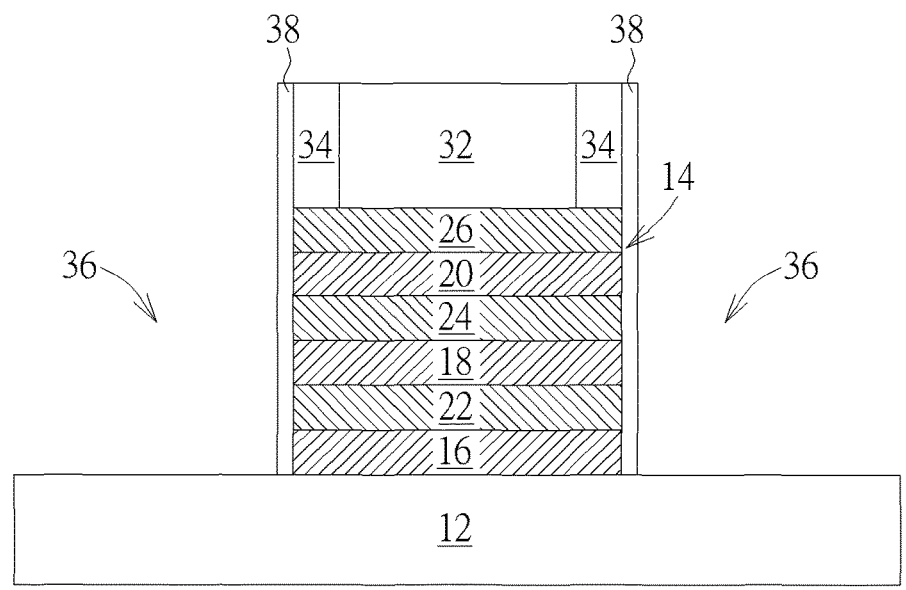

Next, as shown in FIG. 6, a material layer (not shown) is formed on the substrate 12 surface, sidewalls of the stack structure 14, and the hard mask 32, and an etching back process is conducted to remove part of the material layer for forming another spacer 38 adjacent to the spacer 34 and stack structure 14. Preferably, the spacer 38 and spacer 34 are composed of different material. For instance, the spacer 38 in this embodiment is composed of metal oxide dielectric material or a high-k dielectric material, but not limited thereto.

In this embodiment, the metal oxide dielectric material or high-k dielectric material used to form the spacer 38 is preferably selected from dielectric materials having dielectric constant (k value) greater than 4. For instance, the spacer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 7:
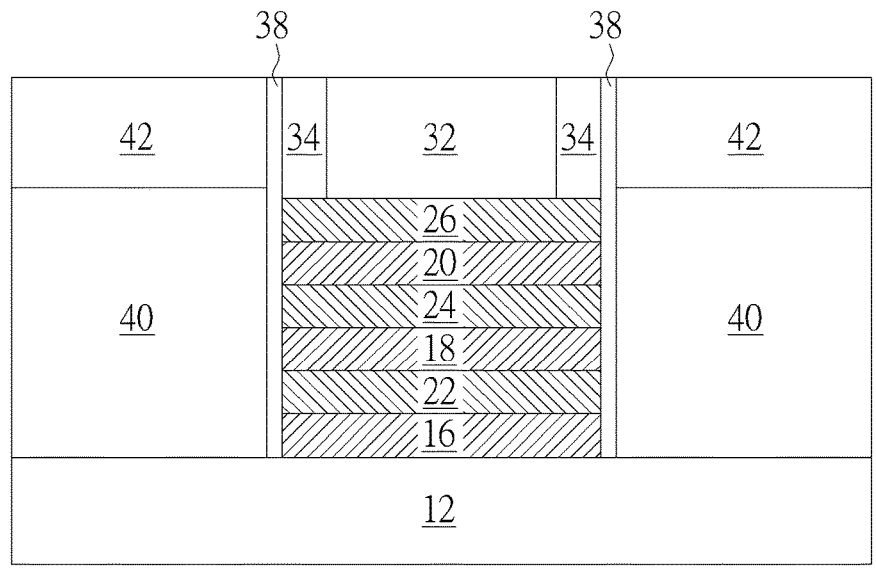

Next, as shown in FIG. 7, a source/drain structure 40 is formed on the substrate 12 adjacent to two sides of the spacer 38, in which the source/drain structure 40 could be composed of semiconductor material or metal material. In this embodiment, if the source/drain structure 40 were made of semiconductor material, it could be selected from the group consisting of germanium, doped silicon, doped germanium, and silicon germanium. If the source/drain structure 40 were made of metal, it could be selected from the group consisting of W, Ti, TiN, Ta, TaN, and Al.

Next, an interlayer dielectric (ILD) layer 42 is formed on the source/drain structure 40 to surround the spacer 38, and a planarizing process, such as chemical mechanical polishing (CMP) is conducted to remove part of the ILD layer 42 so that the top surface of the remaining ILD layer 42 is even with the top surface of the hard mask 32. In this embodiment, the ILD layer 42 could be composed of any dielectric material preferably containing oxides, such as a tetraethyl orthosilicate (TEOS) layer.

Figure 8:
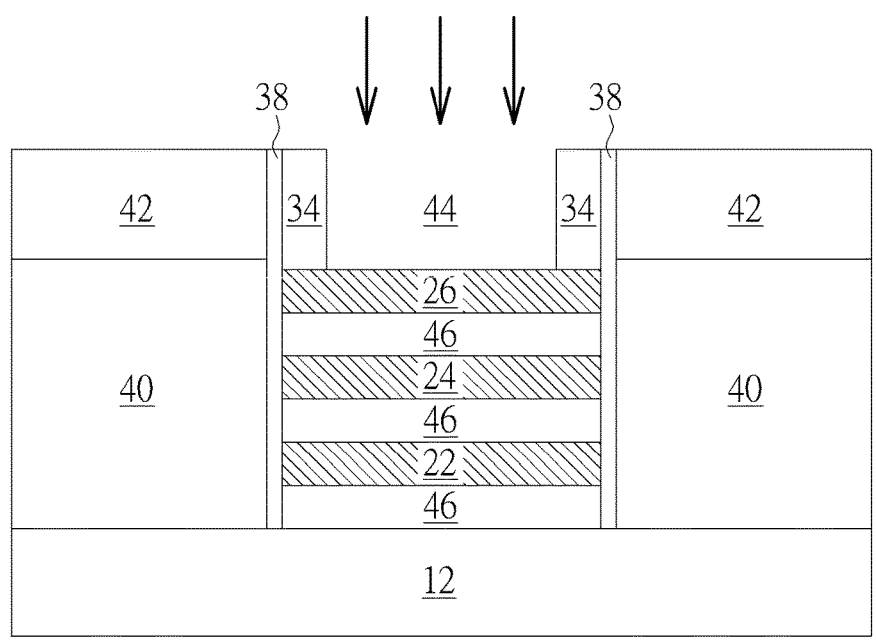

Next, as shown in FIG. 8, an etching process is conducted to remove the hard mask 32 for forming a recess 44, and another selective etching process is conducted to remove the first semiconductor layers 16, 18, 20 for forming recesses 46. Since the first semiconductor layers 16, 18, 20 and the second semiconductor layers 22, 24, 26 are made of different material and a predetermined etching selectivity is found between the two semiconductor layers, it would be desirable to remove the first semiconductor layers 16, 18, 20 without damaging any of the second semiconductor layers 22, 24, 26 during the etching process.

According to an embodiment of the present invention, the first semiconductor layers 16, 18, 20 and the hard mask 32 could also be made of same material. For instance, both the first semiconductor layers 16, 18, 20 and the hard mask 32 could be made of polysilicon while the second semiconductor layers 22, 24, 26 is selected from the group consisting of silicon, germanium, doped silicon, doped germanium, and silicon germanium, and in such instance, only one single etching process is required to remove the hard mask 32 and the first semiconductor layers 16, 18, 20 at the same time, which is also within the scope of the present invention. It should be noted that after removing the first semiconductor layers 16, 18, 20 through etching process, it would be desirable to selectively use an oxidation process or another etching process to remove part of the second semiconductor layers 22, 24, 26 so that the original cubic second semiconductor layers 22, 24, 26 are transformed into cylindrical nanowire channel layers, which is also within the scope of the present invention.

Figure 9:
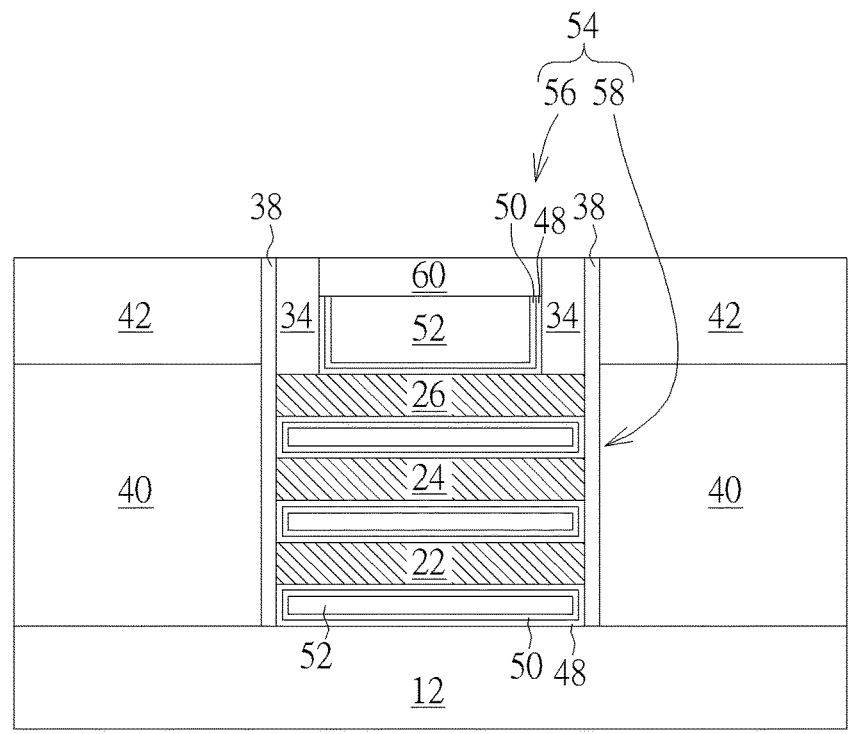

Next, as shown in FIG. 9, a high-k dielectric layer 48, a work function metal layer 50, and a low resistance metal layer 52 are formed in the recess 44 and recesses 46, and a planarizing process is conducted thereafter to form a gate structure 54. In this embodiment, the gate structure 54 preferably includes two parts, in which a first portion 56 is formed directly above the second semiconductor layers 22, 24, 26 while second portions 58 are formed in staggered arrangement or one over another with the second semiconductor layers 22, 24, 26. Viewing from another perspective, the high-k dielectric layer 48 and the work function metal layer 50 are formed to wrap the second semiconductor layers 22, 24, 26 while the low resistance metal layer 52 is formed to fill the recesses 44 and 46.

In this embodiment, the high-k dielectric layer 48 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 50 is formed for tuning the work function of the later formed metal gates to be appropriate in an NMOS or a PMOS. For an NMOS transistor, the work function metal layer 50 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 50 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 50 and the low resistance metal layer 52, in which the material of the barrier layer may include titanium (Ti), titanium nitride (TiN), tantalum (Ta) or tantalum nitride (TaN). Furthermore, the material of the low-resistance metal layer 52 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the high-k dielectric layer 48, part of the work function metal layer 50, and part of the low resistance metal layer 52 are removed to form a recess (not shown), and a hard mask 60 is formed in the recess so that the top surfaces of the hard mask 60 and ILD layer 42 are coplanar. The hard mask 60 could be selected from the group consisting of silicon oxide, silicon nitride, silicon oxynitride, and silicon carbon nitride.

Figure 10:
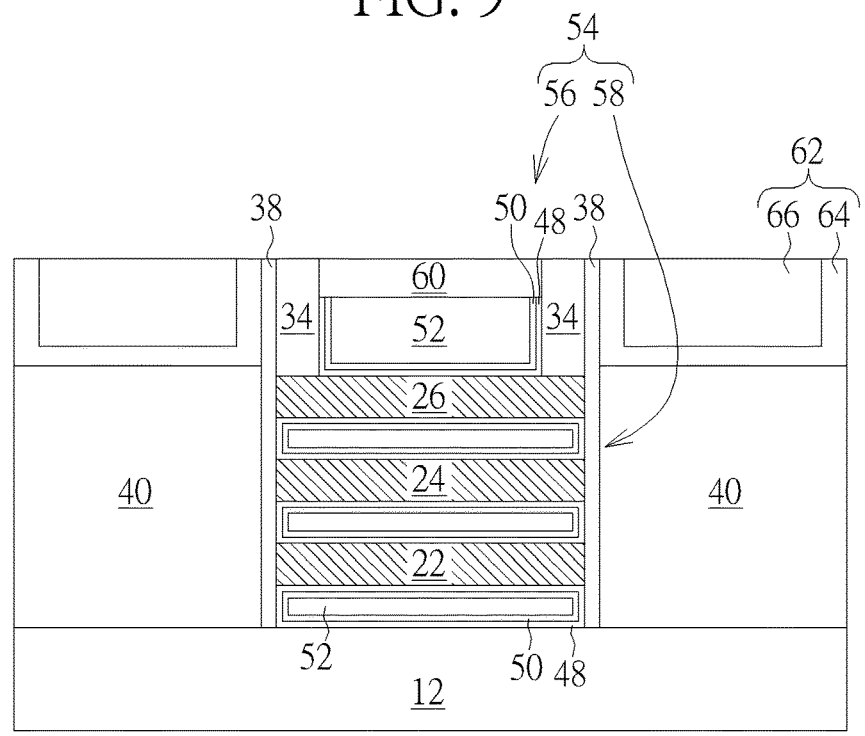

Next, as shown in FIG. 10, a self-aligned contact plug formation process is conducted to form contact plugs 62 electrically connected to the source/drain structure 40. In this embodiment, the formation of the contact plugs 62 could be accomplished by using an etching process to remove the ILD layer 42 completely for forming a recess (not shown) and exposing the surface of source/drain structure 40. Next, a barrier layer 64 and a metal layer 66 are deposited to fill the recess completely, and a planarizing process, such as CMP is conducted to remove part of the metal layer 66 and part of the barrier layer 64 for forming contact plugs 62 in the recess, in which the top surface of the contact plugs 62 is even with the top surface of the gate structure 54. In this embodiment, the barrier layer 64 is selected from the group consisting of Ti, Ta, TiN, TaN, and WN, the metal layer 66 is selected from the group consisting of Al, Ti, Ta, W, Nb, Mo, and Cu, but not limited thereto. This completes the fabrication of a semiconductor device according to a preferred embodiment of the present invention.

It should be noted that in this embodiment, the second semiconductor layers 22, 24, 26 are preferably utilized as a nanowire channel layer, and if the source/drain structure 40 were composed of metal, the source/drain structure 4, the spacer 38, and the second semiconductor layers 22, 24, 26 preferably constitute a metal-insulator semiconductor (MIS). If the source/drain structure 40 were composed of semiconductor material, it would be desirable to form an insulating layer between the contact plugs 62 and source/drain structure 40 so that the source/drain structure 40, insulating layer, and the contact plugs 62 altogether constitute another set of metal-insulator semiconductor.

Figure 11:
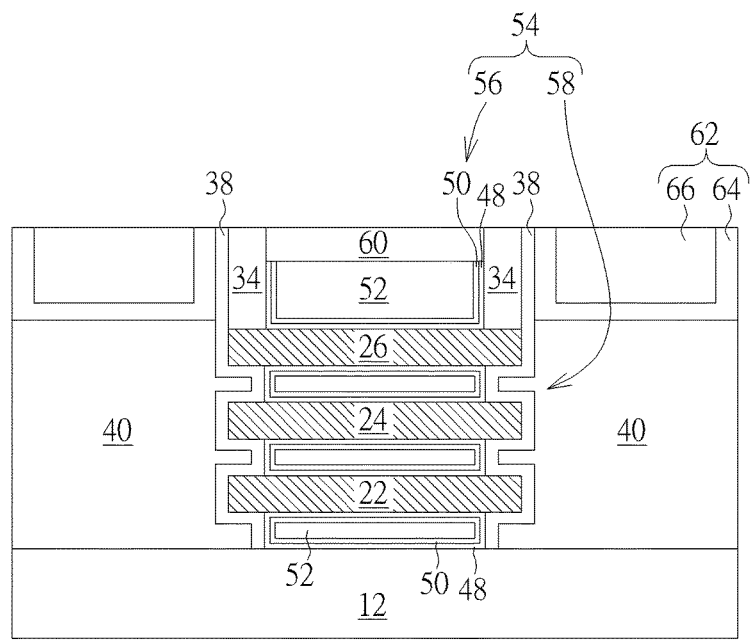
FIG. 11 illustrates a structural view of a nanowire transistor according to another embodiment of the present invention.

Referring to FIG. 11, FIG. 11 illustrates a structural view of a nanowire transistor according to another embodiment of the present invention. In contrast to the approach of removing part of the stack structure 14 to form recess 36 and then forming the spacer 38 directly as shown in FIGS. 5-6, it would be desirable to conduct another etching process to remove part of the first semiconductor layers 16, 18, 20 before the formation of spacer 38 so that the width of each of the first semiconductor layers 16, 18, 20 is less than the width of each of the second semiconductor layers 22, 24, 26. This forms step-like profile along the edges or sidewalls of the first semiconductor layers 16, 18, 20 and second semiconductor layers 22, 24, 26 and since the sidewalls of the first semiconductor layers 16, 18, 20 and second semiconductor layers 22, 24, 26 are not aligned to each other after the etching process, the spacer 38 formed thereafter would reveal a zigzag pattern along the sidewalls of the first semiconductor layers 16, 18, 20 and second semiconductor layers 22, 24, 26. Next, process conducted from FIG. 6 to FIG. 9 could be carried out to form source/drain structure 40 and ILD layer 42, remove the hard mask 32 and first semiconductor layers 16, 18, 20 to form recess, deposit high-k dielectric layer 48, work function metal layer 50, and low resistance metal layer 52 to form gate structure 54, and form contact plugs 62 electrically connected to the source/drain structure 40.

Figure 12:
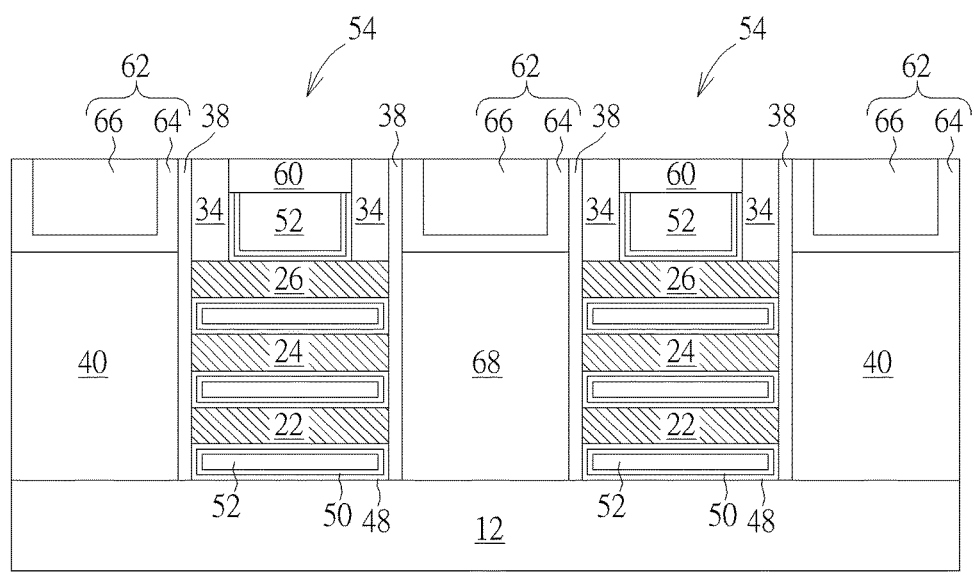
FIG. 12 illustrates a structural view of a nanowire transistor according to another embodiment of the present invention.

Referring to FIG. 12, FIG. 12 illustrates a structural view of a nanowire transistor according to another embodiment of the present invention. In contrast to the single gate nanowire transistor shown in FIG. 10, the present embodiment reveals a dual-gate nanowire transistor, which preferably includes two sets of gate structures 54 on the substrate 12. Preferably, each of the gate structures 54 from this embodiment shares virtually same content as the gate structures from aforementioned embodiments. For instance, each of the gate structures 54 includes a high-k dielectric layer 48, a work function metal layer 50, and a low resistance metal layer 52. In this embodiment, a common or shared source/drain structure 68 is disposed between the two gate structures 54, and contact plugs 62 are electrically connected to the source/drain structures 40 and 68 respectively.

Figure 13:
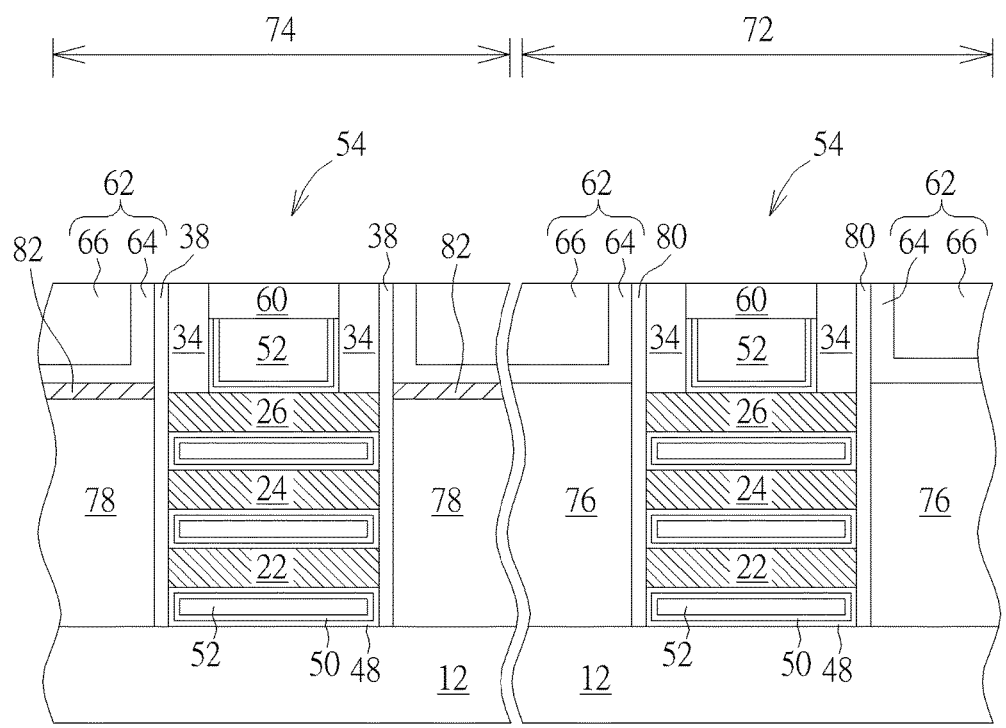
FIG. 13 illustrates a structural view of a nanowire transistor according to another embodiment of the present invention.

Referring to FIG. 13, FIG. 13 illustrates a structural view of a nanowire transistor according to another embodiment of the present invention. In contrast to the single gate nanowire transistor shown in FIG. 10, a dual-gate nanowire transistor is disclosed in this embodiment. Preferably, a gate structure 54 is disposed on a NMOS region 72 on the substrate 12 and another gate structure 54 is disposed on a PMOS region 74 on the substrate 12 in which each of the gate structures 54 shares identical content as the aforementioned gate structures 54. For instance, each of the gate structures 54 includes a high-k dielectric layer 48, a work function metal layer 50, and a low resistance metal layer 52.

In this embodiment, the source/drain structure 76 on the NMOS region 72 is preferably composed of metal, and the source/drain structure 76 and the spacer 80 and second semiconductor layer 22, 24, 26 on NMOS region 72 together constitute a metal-insulator semiconductor. Preferably, the spacer 80 on the NMOS region 72 and the spacer 38 on the PMOS region 74 are made of different material while both spacers 80 and 38 could be made of metal oxide dielectric material and/or high-k dielectric material.

The source/drain structure 78 on the PMOS region 74 is preferably composed of semiconductor material, such as SiGe, and an insulating layer could be formed between the contact plugs 62 and source/drain structure 78 on PMOS region 74 so that the source/drain structure 78, insulating layer, and the contact plugs 62 could form a metal-insulator semiconductor. In this embodiment, no silicide is preferably formed between the contact plugs 62 and the source/drain structure 76 on NMOS region 72 while a silicide 82 is formed between contact plugs 62 and source/drain structure 78 on PMOS region 74. It should be noted that even though the bottom of the silicide 82 is slightly lower than the top surface of second semiconductor layer 26 in this embodiment, the bottom of the silicide 82 could also be higher than the top surface of the second semiconductor layer 26, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nanowire transistor, comprising:
   a substrate;
   a nanowire channel layer on the substrate;
   a gate structure on the nanowire channel layer;
   a source/drain structure adjacent to two sides of the gate structure and contacting the substrate directly, wherein a top surface of the source/drain structure is lower than a top surface of the gate structure and a top surface of the nanowire channel layer; and
   a spacer between and directly contacting the nanowire channel layer and the source/drain structure.

2. The nanowire transistor of claim 1, wherein the nanowire channel layer is selected from the group consisting of silicon, germanium, doped silicon, doped germanium and silicon germanium.

3. The nanowire transistor of claim 1, further comprising a contact plug electrically connected to the source/drain structure, wherein a top surface of the contact plug is even with the top surface of the gate structure and the contact plug and the source/drain structure comprise same material.

4. The nanowire transistor of claim 1, further comprising a contact plug electrically connected to the source/drain structure, wherein a top surface of the contact plug is even with the top surface of the gate structure.

5. The nanowire transistor of claim 1, wherein the spacer comprises a metal oxide dielectric material or a high-k dielectric material.

6. The nanowire transistor of claim 1, further comprising a silicide disposed on the source/drain structure.

\* \* \* \* \*